(12) United States Patent
Ren

(10) Patent No.: US 8,846,483 B2
(45) Date of Patent: Sep. 30, 2014

(54) METHOD OF MANUFACTURING A PHASE CHANGE SEMICONDUCTOR DEVICE AND THE PHASE CHANGE SEMICONDUCTOR DEVICE

(75) Inventor: Wanchun Ren, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 218 days.

(21) Appl. No.: 13/243,862

(22) Filed: Sep. 23, 2011

(65) Prior Publication Data

US 2012/0273745 A1 Nov. 1, 2012

(30) Foreign Application Priority Data

Apr. 29, 2011 (CN) .......................... 2011 1 0110144

(51) Int. Cl.
*H01L 21/20* (2006.01)
*H01L 45/00* (2006.01)
(52) U.S. Cl.
CPC .............. *H01L 45/06* (2013.01); *H01L 45/144* (2013.01); *H01L 45/1683* (2013.01); *H01L 45/1625* (2013.01)
USPC .................................. 438/381; 257/E21.004
(58) Field of Classification Search
USPC ................... 438/102, 381, 382; 257/E21.004
See application file for complete search history.

(56) References Cited

U.S. PATENT DOCUMENTS

| | | | |
|---|---|---|---|
| 2003/0096497 A1* | 5/2003 | Moore et al. .................. | 438/652 |
| 2003/0122170 A1* | 7/2003 | Apodaca et al. .............. | 257/295 |
| 2005/0142863 A1* | 6/2005 | Spandre ........................ | 438/640 |
| 2006/0148248 A1* | 7/2006 | Brooks et al. ................. | 438/654 |
| 2007/0020931 A1* | 1/2007 | Koura et al. .................. | 438/687 |
| 2007/0134899 A1* | 6/2007 | Kanki et al. .................. | 438/597 |
| 2009/0233421 A1* | 9/2009 | Lee et al. ....................... | 438/478 |

FOREIGN PATENT DOCUMENTS

| | | |
|---|---|---|
| CN | 101005046 | 7/2007 |
| CN | 101005056 | 7/2007 |

OTHER PUBLICATIONS

Office Action from corresponding Chinese Patent Appl. No. 201110110144.9, dated Jan. 16, 2014.

* cited by examiner

*Primary Examiner* — Daniel Luke
*Assistant Examiner* — Latanya N Crawford
(74) *Attorney, Agent, or Firm* — Koppel, Patrick, Heybl & Philpott; Michael J. Ram

(57) ABSTRACT

This disclosure is directed to a phase change semiconductor device and a manufacturing method thereof, comprising: forming an insulating layer on a substrate and a metal layer on the insulating layer; forming a via hole penetrating from the metal layer to the insulating layer; forming a phase change material layer on the metal layer and the via hole to at least fill up the via hole; and performing a planarization process, wherein after forming the metal layer and before forming the via hole, or after forming the via hole and before forming the phase change material layer, or after forming the phase change material layer and before the planarization process, subjecting the metal layer to an annealing treatment to form a metallic compound layer at an interface between the metal layer and the insulating layer. Adhesion between the phase change material layer and the insulating layer can be improved.

13 Claims, 14 Drawing Sheets

METHOD OF MANUFACTURING A PHASE CHANGE SEMICONDUCTOR DEVICE AND THE PHASE CHANGE SEMICONDUCTOR DEVICE

CROSS-REFERENCE TO RELATED APPLICATIONS

This application claims priority to Chinese Patent Application No. 201110110144.9, filed on Apr. 29, 2011 and entitled "Method of Manufacturing a Phase Change Semiconductor Device and the Phase Change Semiconductor Device", which is incorporated herein by reference in its entirety.

BACKGROUND OF THE INVENTION

1. Field of the Invention

This disclosure relates to the field of semiconductor device manufacturing, and in particular relates to a method of manufacturing a phase change semiconductor device and the phase change semiconductor device.

2. Description of the Related Art

A phase change material such as a chalcogenide can be subjected to a reversible phase change between a crystalline state and an amorphous state. When the phase change material is in a crystalline state, it has a lower resistivity; whereas when the phase change material is in an amorphous state, it has a higher resistivity.

Taking advantage of this property, a phase change material can be used to implement a phase change semiconductor device. One example of a phase change semiconductor device is a phase change memory. A phase change memory has excellent properties such as one-bit-alterability, nonvolatility, fast reading speed, no necessity to be erased separately etc., and thus is considered widely as one of the most promising candidates for advanced semiconductor processes.

FIG. 1 is a schematic diagram illustrating a basic structure of a phase change semiconductor device. As shown in FIG. 1, a phase change material layer 150 is formed in a via hole in an insulating layer 120 on a substrate 110, and the phase change material layer 150 is sandwiched between a top electrode 165 and a bottom electrode 115. In addition, FIGS. 2A and 2B illustrate structures obtained after forming the phase change material layer 150 and after performing a planarization process in a conventional phase change semiconductor device manufacturing process, respectively.

The present inventor has conducted in-depth investigation on the conventional phase change semiconductor device manufacturing process, and has found that the following problems exist.

When performing a planarization process after forming the phase change material layer 150 on the insulating layer 120 (see FIGS. 2A and 2B), the formed phase change material layer 150 is easy to be peeled off due to the shear stress of the planarization process. In order to avoid peeling off the formed phase change material layer, the downward force in the planarization process has to be small, and thus more polishing time is needed to remove a bulk phase change material layer, which results in poor uniformity and very limited process window of the planarization process.

In addition, when forming the phase change material layer 150 on the insulating layer 120 (referring to FIG. 2A), if the formed phase change material layer 150 is thick, it is easy to be peeled off. The peeling off of the formed phase change material layer not only decreases the productivity of devices, but also reduces the lifetime of dummy wafers (wafers that are processed during manufacturing but are not used for devices), which results in increase of the manufacturing cost.

SUMMARY OF THE INVENTION

This disclosure is proposed in view of the above problems.

An object of one aspect of this disclosure is to provide a method of manufacturing a phase change semiconductor device and the phase change semiconductor device, and the method of manufacturing the phase change semiconductor device is capable of improving adhesion between a phase change material layer and an insulating layer during a planarization process of the phase change material layer.

An object of another aspect of this disclosure is to provide a method of manufacturing a phase change semiconductor device and the phase change semiconductor device, and the method of manufacturing the phase change semiconductor device is capable of improving adhesion between a phase change material layer and an insulating layer during the formation of the phase change material layer.

According to a first aspect of this disclosure, there is provided a method of manufacturing a phase change semiconductor device, comprising steps of: forming an insulating layer on a substrate; forming a metal layer on the insulating layer; forming a via hole penetrating from the metal layer to the insulating layer; forming a phase change material layer on the metal layer and the via hole so as to at least fill up the via hole; and performing a planarization process, wherein the method further comprises a step of: after forming the metal layer and before forming the via hole, or after forming the via hole and before forming the phase change material layer, or after forming the phase change material layer and before performing the planarization process, subjecting the metal layer to an annealing treatment so as to form a metallic compound layer at an interface between the metal layer and the insulating layer.

Preferably, the step of performing the planarization process makes the insulating layer and the phase change material layer in the via hole exposed.

Preferably, a temperature of the annealing treatment is in a range of 200° C. to 400° C., and a time of the annealing treatment is in a range of 10 minutes to 120 minutes.

Preferably, the metal layer is a Mn layer, a Ni layer, an Al layer, a Mg layer, a Co layer or a Ti layer.

Preferably, the metal layer is a Mn layer, and the metallic compound layer is a Mn—Si—O layer.

Preferably, the step of forming the metal layer on the insulating layer comprises: forming the metal layer with a thickness in a range of 50 Å to 500 Å on the insulating layer.

Preferably, the phase change material layer is a chalcogenide layer.

Preferably, the chalcogenide layer is a Ge—Sb—Te layer, a Ge—Te layer, a Sb—Te layer, an As—Sb—Te layer, a Si—Sb—Te layer, a Ge—Bi—Te layer, a Sn—Sb—Te layer, an In—Sb—Te layer or a Ga—Sb—Te layer.

Preferably, the insulating layer is a silicon oxide layer.

Preferably, the phase change material layer is formed by physical vapor deposition.

Preferably, the planarization process is performed by chemical mechanical planarization.

Preferably, the method further comprises a step of subjecting the substrate to a degassing treatment before forming the metal layer on the insulating layer.

Preferably, a temperature of the degassing treatment is in a range of 250° C. to 400° C., and a time of the degassing treatment is in a range of 1 minute to 30 minutes.

According to a second aspect of this disclosure, there is provided a phase change semiconductor device, comprising a phase change material layer formed on an insulating layer having a via hole, wherein a laminated layer comprising a metal layer and a metallic compound layer beneath the metal layer is formed at an interface between the insulating layer and the phase change material layer outside the via hole.

Preferably, the metal layer is a Mn layer, a Ni layer, an Al layer, a Mg layer, a Co layer or a Ti layer.

Preferably, the metal layer is a Mn layer, and the metallic compound layer is a Mn—Si—O layer.

Preferably, the phase change material layer is a chalcogenide layer.

Preferably, the chalcogenide layer is a Ge—Sb—Te layer, a Ge—Te layer, a Sb—Te layer, an As—Sb—Te layer, a Si—Sb—Te layer, a Ge—Bi—Te layer, a Sn—Sb—Te layer, an In—Sb—Te layer or a Ga—Sb—Te layer.

Preferably, the insulating layer is a silicon oxide layer.

According to each of the above aspects of this disclosure, since the laminated layer comprising the metal layer and the metallic compound layer beneath the metal layer and used for improving adhesion is formed between the phase change material layer and the insulating layer, adhesion between the phase change material layer and the insulating layer can be improved during the phase change semiconductor device manufacturing process (e.g., during the formation of the phase change material layer and/or during the planarization process).

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is to be noted that, in the accompanying drawings, for convenience of description, the sizes of respective components may not be drawn based on actual scales.

The objects, features and advantages of this disclosure will become apparent from the following detailed description of exemplary embodiments with reference to the accompanying drawings.

DESCRIPTION OF THE EMBODIMENTS

After in-depth investigation, the present inventor has found that, during a phase change semiconductor device manufacturing process, it is possible to form a laminated layer, which comprises a metal layer and a self-formed metallic compound layer beneath the metal layer, at an interface between an insulating layer and a phase change material layer outside a via hole in the insulating layer, wherein the metal layer is on the side of the phase change material layer, and the metallic compound layer is on the side of the insulating layer. This enables to improve adhesion between the phase change material layer and the insulating layer during the phase change semiconductor device manufacturing process (e.g., during the formation of the phase change material layer and/or during a planarization process).

In addition, after in-depth investigation, the present inventor has also found that, after the planarization process, it is possible to remove the laminated layer comprising the metal layer and the metal compound layer beneath the metal layer so as to expose the insulating layer and the phase change material layer in the via hole. That is, the laminated layer is used as a sacrificial layer. This enables not only to improve adhesion between the phase change material layer and the insulating layer by using the laminated layer during the phase change semiconductor device manufacturing process, but also to avoid the possible thermal short circuit or electrical short circuit in the phase change semiconductor device caused by the laminated layer.

Exemplary embodiments of this disclosure will be described in detail below with reference to the accompanying drawings. It shall be noted that the following description is merely illustrative in nature. The components and steps set forth in the embodiments do not limit the scope of this disclosure unless it is otherwise specifically stated. In addition, techniques, methods and devices known by persons skilled in the art may not be discussed in detail, but are intended to be a part of the specification where appropriate.

First Embodiment

In a first embodiment of this disclosure, a laminated layer, which comprises a metal layer and a metallic compound layer beneath the metal layer and which is used for improving adhesion, is formed after forming the metal layer and before forming a via hole in an insulating layer. This enables the first embodiment of this disclosure to improve adhesion between a phase change material layer and the insulating layer during the formation of the phase change material layer and during a planarization process.

Figure 3:
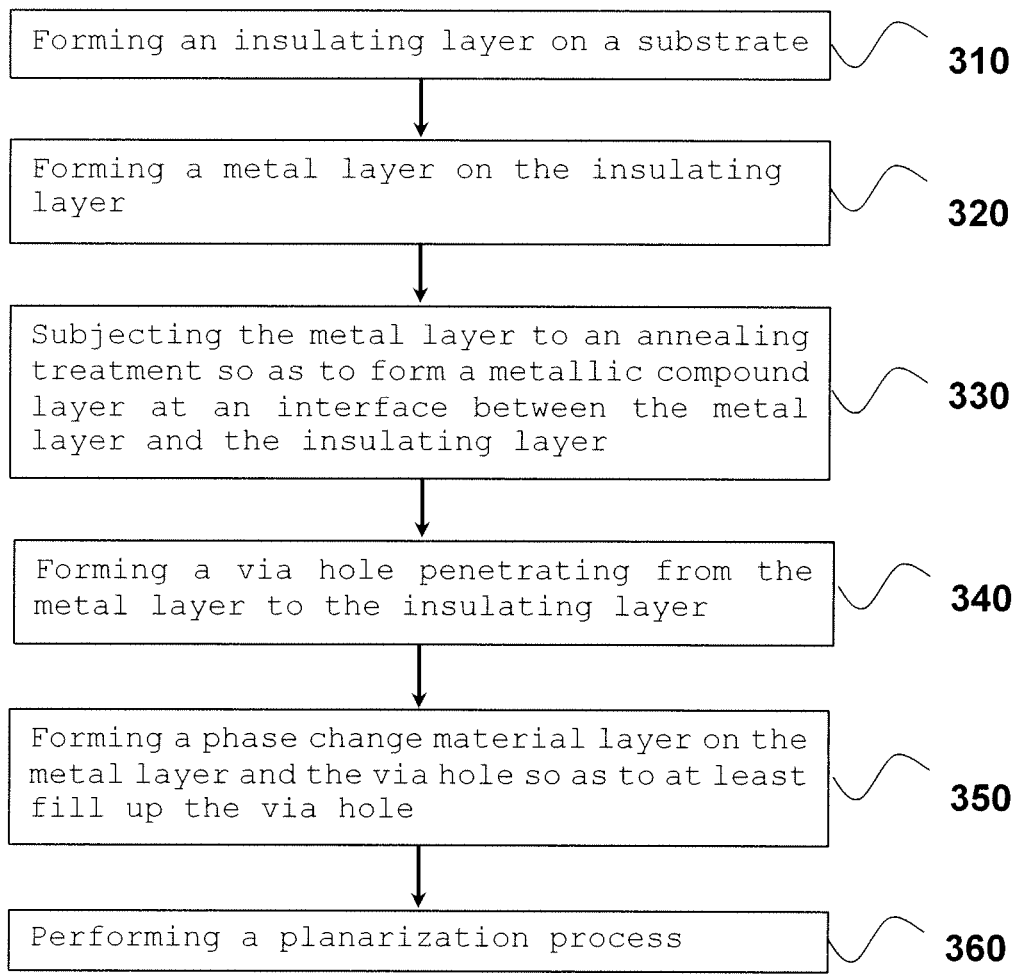
FIG. 3 is a flowchart illustrating a method of manufacturing a phase change semiconductor device according to a first embodiment of this disclosure.

FIG. 3 is a flowchart illustrating a method of manufacturing a phase change semiconductor device according to the first embodiment of this disclosure. FIGS. 4A-4G are schematic diagrams illustrating structures obtained after the respective steps in the method of manufacturing the phase change semiconductor device according to the first embodiment of this disclosure. The first embodiment of this disclosure will be described in detail below with referent to FIGS. 3 and 4A-4G.

Figure 4A:
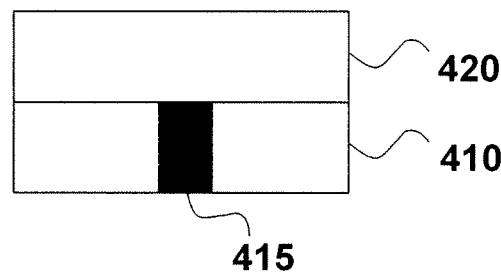
FIGS. 4A-4G are schematic diagrams illustrating structures obtained after the respective steps in the method of manufacturing the phase change semiconductor device according to the first embodiment of this disclosure.

First, in step 310 of FIG. 3, an insulating layer 420 is formed on a substrate 410 (referring to FIG. 4A). The material of the insulating layer 420 is not limited particularly, and it may be, for example, a silicon oxide layer. Alternatively, the insulating layer 420 may be, for example, a laminated layer comprising a silicon oxide layer and a silicon nitride layer beneath the silicon oxide layer, wherein the silicon nitride layer is used as an etching stop layer during the subsequent etching of the insulating layer 420. In addition, as shown in FIG. 4A, a bottom electrode 415 used for the phase change semiconductor device is formed in the substrate 410.

Incidentally, optionally, after forming the insulating layer 420 on the substrate 410, it can be subjected to a degassing treatment so as to remove water vapor or the like therein, which is advantageous for the subsequent formation of a metallic compound layer at an interface between a metal layer and the insulating layer by subjecting the metal layer to an annealing treatment. A temperature of the degassing treatment may be, for example, in a range of 250° C. to 400° C. (such as 350° C.), and a time of the degassing treatment may be, for example, in a range of 1 minute to 30 minutes.

Figure 4B:
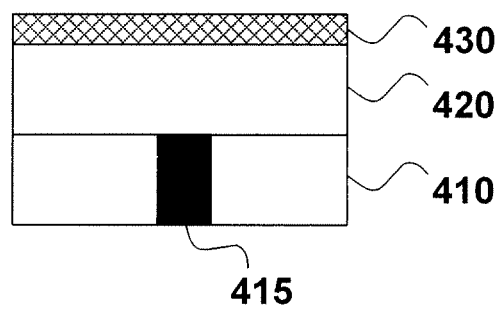

Next, in step 320 of FIG. 3, a metal layer 430 is formed on the insulating layer 420 (referring to FIG. 4B). The material of the metal layer 430 is not limited particularly too, and it may be, for example, Mn, Ni, Al, Mg, Co or Ti. As will be understood from the following description, a metallic compound layer will be formed at an interface between the metal layer 430 and the insulating layer 420 by subjecting the metal layer 430 to an annealing treatment, and a laminated layer comprising the metal layer and the metallic compound layer will improve adhesion between a phase change material layer and the insulating layer during the phase change semiconductor device manufacturing process. Thus, the materials of the metal layer 430 as enumerated here are only examples; and it is known to persons skilled in the art from the above description of the use of the metal layer 430 that, the material of the metal layer 430 is not limited particularly as long as a metallic compound layer can be formed at the interface between the metal layer 430 and the insulating layer 420 by subjecting the metal layer 430 to an annealing treatment so as to improve adhesion between a phase change material layer and the insulating layer during the phase change semiconductor device manufacturing process. In addition, the method of forming the metal layer 430 is not limited particularly, and it may be, for example, physical vapor deposition etc. The thickness of the formed metal layer 430 may be, for example, in a range of 50 Å to 500 Å.

Figure 4C:
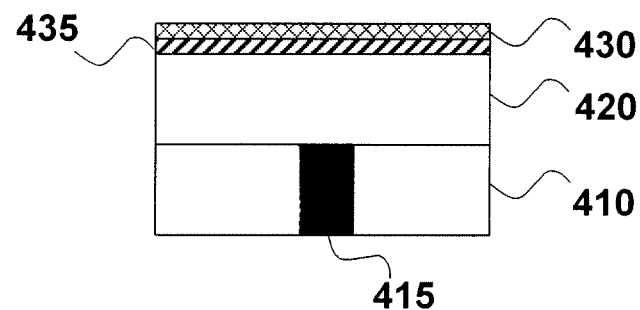

Then, in step 330 of FIG. 3, the metal layer 430 is subjected to an annealing treatment so as to form a metallic compound layer 435 at the interface between the metal layer 430 and the insulating layer 420 (referring to FIG. 4C). As for the formed laminated layer comprising the metal layer 430 and the metallic compound layer 435, the metal layer 430 is on the side of a phase change material layer to be formed, and the self-formed metallic compound layer 435 is on the side of the insulating layer 420. Since the coupling property of the metal layer 430 and the phase change material layer to be formed is good, and the coupling property of the metallic compound layer 435 and the insulating layer 420 is good, adhesion between the phase change material layer and the insulating layer can be improved during the subsequent phase change semiconductor device manufacturing process. For example, when the metal layer 430 is a Mn layer and the insulating layer 420 is a silicon oxide layer, the metallic compound layer 435 formed after the annealing treatment is a Mn—Si—O layer. In addition, a temperature of the annealing treatment may be, for example, in a range of 200° C. to 400° C., a time of the annealing treatment may be, for example, in a range of 10 minutes to 120 minutes, and an atmosphere of the annealing treatment may not be limited particularly.

Figure 4D:
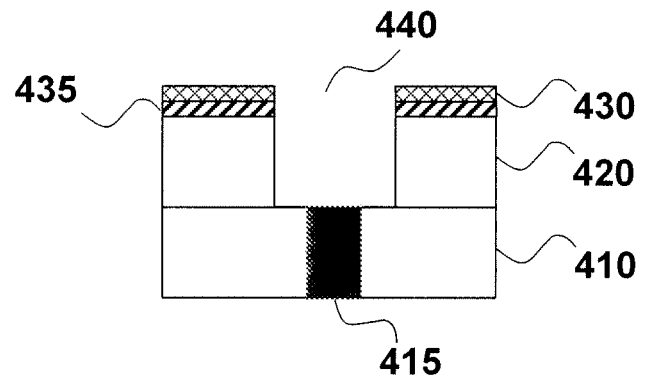

Next, in step 340 of FIG. 3, a via hole 440 is formed penetrating from the metal layer 430 to the insulating layer 420 (referring to FIG. 4D). As shown in FIG. 4D, the formed via hole 440 exposes the bottom electrode 415 in the substrate 410. The shape of the via hole 440 is not limited particularly. In addition, the process of forming the via hole 440 has been well known to persons skilled in the art (for example the via hole 440 can be formed by etching), and thus will not be described in detail here.

Figure 4E:
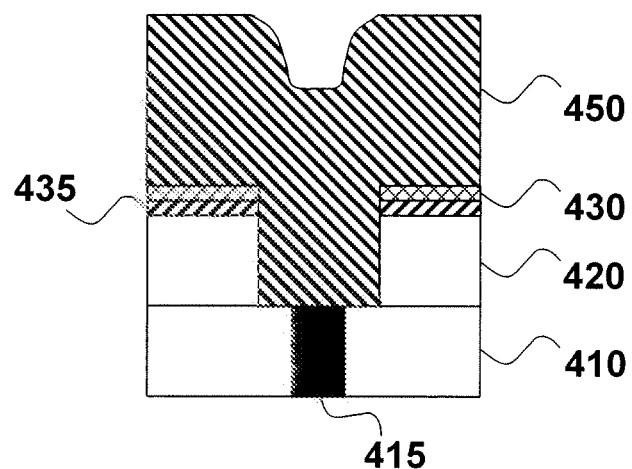

After forming the via hole 440, in step 350 of FIG. 3, a phase change material layer 450 is formed on the metal layer 430 and the via hole 440 so as to at least fill up the via hole 440 (referring to FIG. 4E). As shown in FIG. 4E, after filling the phase change material layer 450 in the via hole 440, the bottom electrode 415 in the substrate 410 is electrically connected to the phase change material layer 450 filled in the via hole 440. The phase change material layer 450 may be, for example, a chalcogenide layer. The chalcogenide layer may be, for example, a Ge—Sb—Te layer, a Ge—Te layer, a Sb—Te layer, an As—Sb—Te layer, a Si—Sb—Te layer, a Ge—Bi—Te layer, a Sn—Sb—Te layer, an In—Sb—Te layer, a Ga—Sb—Te layer etc. The Ge—Sb—Te layer may be, for example, a $Ge_2Sb_2Te_5$ layer. In addition, the method of forming the phase change material layer 450 is not limited particularly, and it may be, for example, physical vapor deposition (such as sputtering), chemical vapor deposition etc.

Figure 1:
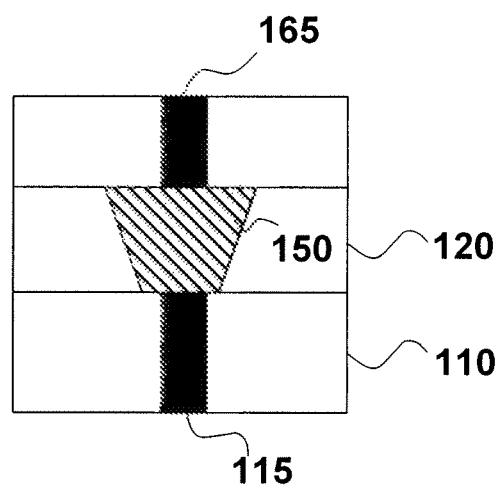
FIG. 1 is a schematic diagram illustrating a basic structure of a phase change semiconductor device.
Figure 2A:
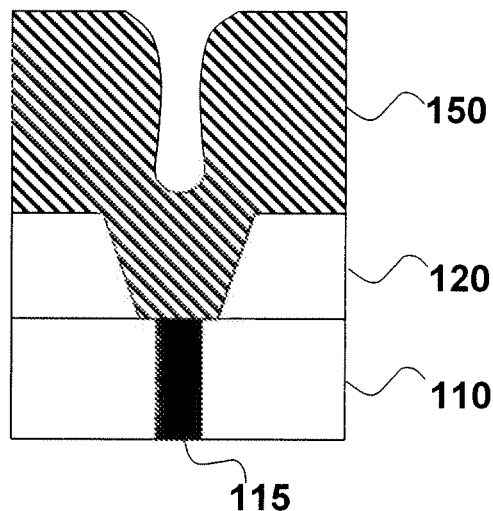
FIG. 2A is a schematic diagram illustrating a structure obtained after forming a phase change material layer in the conventional phase change semiconductor device manufacturing process.

As can been from FIG. 4E, in the first embodiment according to this disclosure, during the formation of the phase change material layer 450, there is the laminated layer comprising the metal layer 430 and the metallic compound layer 435 beneath the metal layer 430 which is formed at an interface between the insulating layer 420 and the phase change material layer 450 outside the via hole 440 in the insulating layer 420, wherein the metal layer 430 is on the side of the phase change material layer 450, and the metallic compound layer 435 is on the side of the insulating layer 420. This enables to improve adhesion between the phase change material layer 450 and the insulating layer 420 during the formation of the phase change material layer 450. Thus, as compared with the prior art shown in FIG. 2A, even when the formed phase change material layer 450 is thick, it is not easy to be peeled off. This enables not only to increase the productivity of devices, but also to prolong the lifetime of dummy wafers, thereby the manufacturing cost is reduced.

Incidentally, as shown in FIG. 4E, the laminated layer, which comprises the metal layer 430 and the metallic compound layer 435 beneath the metal layer 430 and which is used for improving adhesion, is formed only at the interface between the insulating layer 420 and the phase change material layer 450 outside the via hole 440 in the insulating layer 420, and is not formed at an interface between the insulating layer 420 and the phase change material layer 450 inside the via hole 440. The reasons are as follows: first, since the phase change material layer 450 inside the via hole 440 is less liable to be peeled off than the phase change material layer 450 outside the via hole 440, it is sufficient to improve adhesion between the phase change material layer 450 and the insulating layer 420 during the phase change semiconductor device manufacturing process by forming the laminated layer only at the interface between the insulating layer 420 and the phase change material layer 450 outside the via hole 440; second, no laminated layer at the interface between the insulating layer 420 and the phase change material layer 450 inside the via hole 440 further avoids the possible thermal short circuit or electrical short circuit in the phase change semiconductor device.

Then, in step 360 of FIG. 3, a planarization process is performed. After performing the planarization process, the laminated layer comprising the metal layer 430 and the metallic compound layer 435 beneath the metal layer 430 can be retained. Alternatively, after performing the planarization process, the laminated layer may also be removed so as to expose the insulating layer 420 and the phase change material layer 450 in the via hole 440 (referring to FIG. 4F). The method of the planarization process is not limited particularly, and it may be, for example, chemical mechanical planarization etc.

Figure 2B:
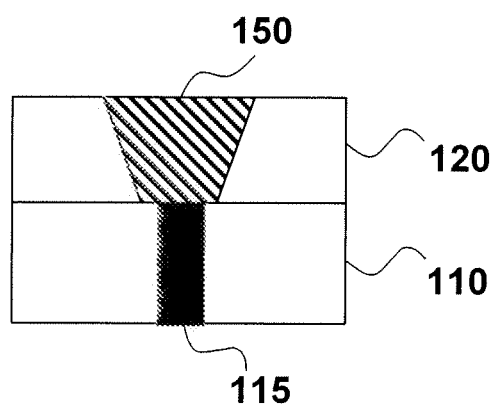
FIG. 2B is a schematic diagram illustrating a structure obtained after performing a planarization process in the conventional phase change semiconductor device manufacturing process.
Figure 4F:
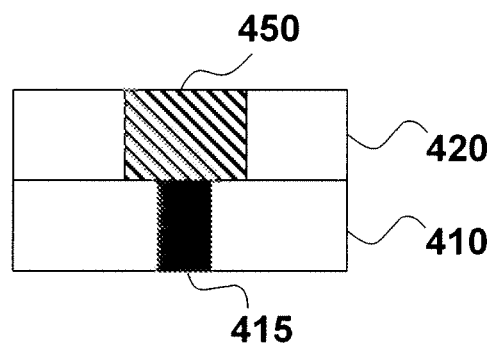
Figure 4G:
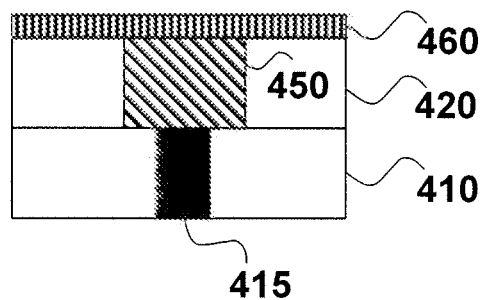

As can be seen from FIGS. 4E-4F, in the first embodiment according to this disclosure, during the planarization process, there is also the laminated layer comprising the metal layer 430 and the metallic compound layer 435 beneath the metal layer 430 which is formed at the interface between the insulating layer 420 and the phase change material layer 450 outside the via hole 440 in the insulating layer 420, wherein the metal layer 430 is on the side of the phase change material layer 450, and the metallic compound layer 435 is on the side of the insulating layer 420. This enables to improve adhesion between the phase change material layer 450 and the insulating layer 420 during the planarization process too. Therefore, as compared with the prior art shown in FIGS. 2A-2B, the phase change material layer 450 is less liable to be peeled off due to the shear stress of the planarization process. Thus, the downward force in the planarization process may be larger, and thus the polishing time needed to remove a bulk phase change material layer may be less, which enables the planarization process to have better uniformity and larger process window.

In addition, as can be seen from FIG. 4F, in the first embodiment according to this disclosure, after the planarization process, the laminated layer comprising the metal layer 430 and the metallic compound layer 435 beneath the metal layer 430 may be removed so as to expose the insulating layer 420. That is, the laminated layer is used as a sacrificial layer. This enables not only to improve adhesion between the phase change material layer 450 and the insulating layer 420 by using the laminated layer during the formation of the phase change material layer 450 and during the planarization process, but also to avoid the possible thermal short circuit or electrical short circuit in the phase change semiconductor device caused by the laminated layer.

Incidentally, after the planarization process, for example, a top electrode layer 460 may be formed on the phase change material layer 450 exposed in the via hole 440 (referring to FIG. 4G), and the top electrode layer 460 may be patterned into a top electrode.

According to the method of manufacturing the phase change semiconductor device of the first embodiment of this disclosure shown in FIGS. 3 and 4A-4G, a phase change semiconductor device may be formed, the phase change semiconductor device comprising the phase change material layer 450 formed on the insulating layer 420 having the via hole 440, wherein the laminated layer comprising the metal layer 430 and the metallic compound layer 435 beneath the metal layer 430 is formed at the interface between the insulating layer 420 and the phase change material layer 450 outside the via hole 440 (referring to FIG. 4E).

As can be seen from the above, in the method of manufacturing the phase change semiconductor device according to the first embodiment of this disclosure, the laminated layer comprising the metal layer and the metallic compound layer beneath the metal layer is formed after forming the metal layer and before forming the via hole in the insulating layer, wherein the metal layer is on the side of the phase change material layer to be formed, and the metallic compound layer is on the side of the insulating layer. Since the coupling property of the metal layer and the phase change material layer is good, and the coupling property of the metallic compound layer and the insulating layer is good, adhesion between the phase change material layer and the insulating layer can be improved during the subsequent formation of the phase change material layer and during the subsequent planarization process by the laminated layer. This not only enables the forming process of the phase change material layer to have increased productivity of devices, but also enables the planarization process to have better uniformity and larger process window.

In addition, since the metal layer is formed on the whole insulating layer and the metallic compound layer is self-formed by subjecting the metal layer to an annealing treatment (referring to FIGS. 4B and 4C), neither of the forming processes of the metal layer and the metallic compound layer needs to use an additional mask and photolithography process etc. so that the forming process of the laminated layer for improving adhesion is simple and has low cost.

In addition, since the laminated layer comprising the metal layer and the metallic compound layer beneath the metal layer can be used as a sacrificial layer (i.e., removed after the planarization process), the possible thermal short circuit or electrical short circuit in the phase change semiconductor device caused by the laminated layer can be further avoided.

Second Embodiment

A second embodiment of this disclosure differs from the first embodiment in the time of subjecting the metal layer to an annealing treatment so as to form the metallic compound layer at the interface between the metal layer and the insulating layer. Specifically, in the second embodiment of this disclosure, the laminated layer for improving adhesion is formed after forming the via hole in the insulating layer and before forming the phase change material layer.

Figure 5:
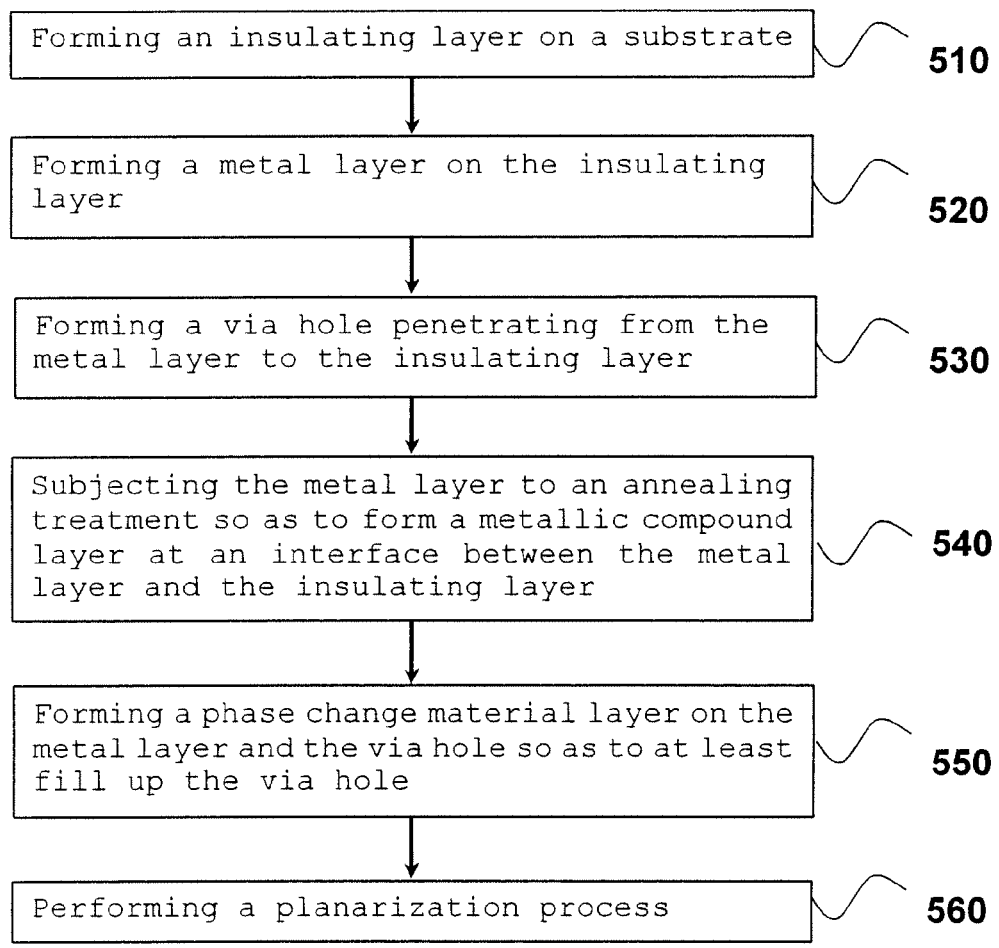
FIG. 5 is a flowchart illustrating a method of manufacturing a phase change semiconductor device according to a second embodiment of this disclosure.

FIG. 5 is a flowchart illustrating a method of manufacturing a phase change semiconductor device according to the second embodiment of this disclosure. FIGS. 6A-6G are schematic diagrams illustrating structures obtained after the respective steps in the method of manufacturing the phase change semiconductor device according to the second embodiment of this disclosure, wherein portions similar to those in FIGS. 4A-4G according to the first embodiment are denoted by similar reference signs. The second embodiment of this disclosure will be described below with referent to FIGS. 5 and 6A-6G, wherein only the difference between the second embodiment and the first embodiment will be described in detail; other parts of the second embodiment are the same as those in the first embodiment, and description of the first embodiment may be referred to for details.

Figure 6A:
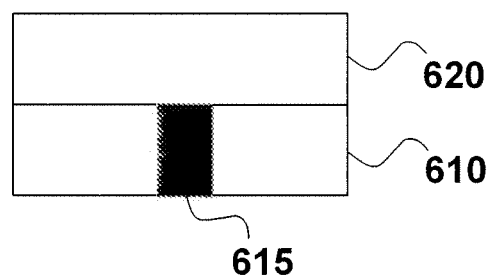
FIGS. 6A-6G are schematic diagrams illustrating structures obtained after the respective steps in the method of manufacturing the phase change semiconductor device according to the second embodiment of this disclosure.

First, in step 510 of FIG. 5, an insulating layer 620 is formed on a substrate 610 (referring to FIG. 6A). In addition, a bottom electrode 615 used for the phase change semiconductor device is formed in the substrate 610.

Incidentally, optionally, after forming the insulating layer 620 on the substrate 610, it can be subjected to a degassing treatment so as to remove water vapor or the like therein.

Figure 6B:
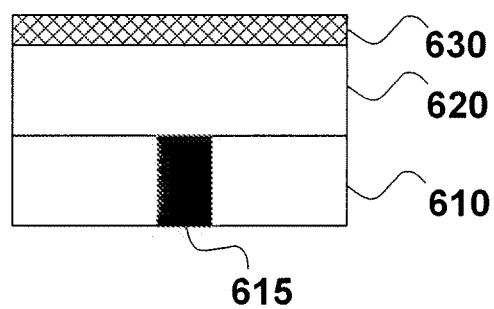

Next, in step 520 of FIG. 5, a metal layer 630 is formed on the insulating layer 620 (referring to FIG. 6B). The material of the metal layer 630 is not limited particularly, and it may be, for example, Mn, Ni, Al, Mg, Co or Ti.

Figure 6C:
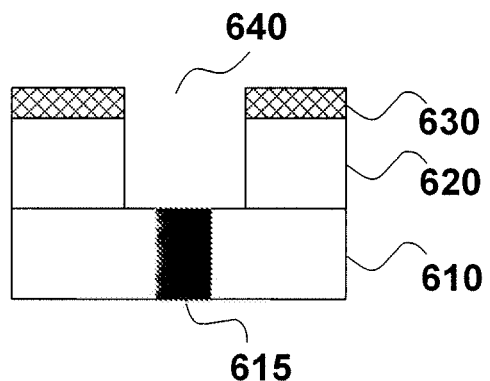

Then, in step 530 of FIG. 5, a via hole 640 is formed penetrating from the metal layer 630 to the insulating layer 620 (referring to FIG. 6C). The formed via hole 640 exposes the bottom electrode 615 in the substrate 610.

Figure 6D:
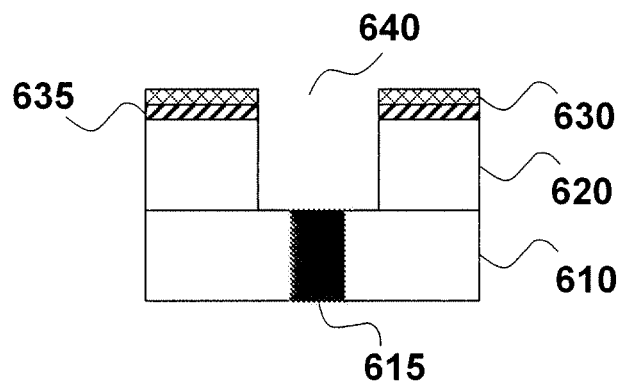

Next, in step 540 of FIG. 5, subjecting the metal layer 630 to an annealing treatment so as to form a metallic compound layer 635 at an interface between the metal layer 630 and the insulating layer 620 (referring to FIG. 6D). For example, when the metal layer 630 is a Mn layer and the insulating layer 620 is a silicon oxide layer, the metallic compound layer 635 formed after the annealing treatment is a Mn—Si—O layer.

Figure 6E:
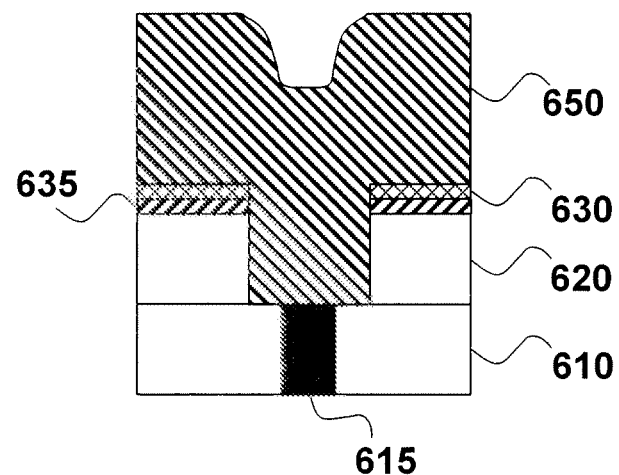

After performing the annealing treatment, in step 550 of FIG. 5, a phase change material layer 650 is formed on the metal layer 630 and the via hole 640 so as to at least fill up the via hole 640 (referring to FIG. 6E). After filling the phase change material layer 650 in the via hole 640, the bottom electrode 615 in the substrate 610 is electrically connected to the phase change material layer 650 filled in the via hole 640.

As can be seen from FIG. 6E, in the second embodiment according to this disclosure, during the formation of the phase change material layer 650, there is a laminated layer comprising the metal layer 630 and the metallic compound layer 635 beneath the metal layer 630 which is formed at an interface between the insulating layer 620 and the phase change material layer 650 outside the via hole 640 in the insulating layer 620, wherein the metal layer 630 is on the side of the phase change material layer 650, and the metallic compound layer 635 is on the side of the insulating layer 620.

Incidentally, as shown in FIG. 6E, the laminated layer, which comprises the metal layer 630 and the metallic compound layer 635 beneath the metal layer 630 and which is used for improving adhesion, is only formed at the interface between the insulating layer 620 and the phase change material layer 650 outside the via hole 640 in the insulating layer 620, and is not formed at an interface between the insulating layer 620 and the phase change material layer 650 inside the via hole 640.

Then, in step 560 of FIG. 5, a planarization process is performed. After performing the planarization process, the laminated layer comprising the metal layer 630 and the metallic compound layer 635 beneath the metal layer 630 may be retained. Alternatively, after performing the planarization process, the laminated layer may also be removed so as to expose the insulating layer 620 and the phase change material layer 650 in the via hole 640 (referring to FIG. 6F).

Figure 6F:
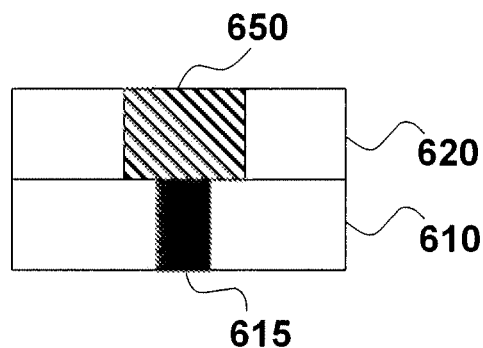
Figure 6G:
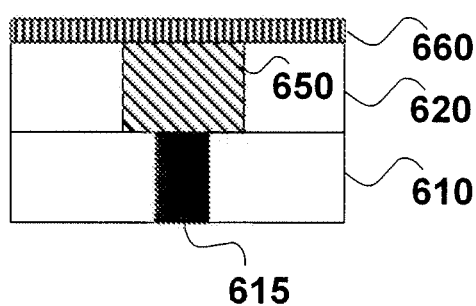

As can be seen from FIGS. 6E-6F, in the second embodiment according to this disclosure, during the planarization process, there is also the laminated layer comprising the metal layer 630 and the metallic compound layer 635 beneath the metal layer 630 which is formed at the interface between the insulating layer 620 and the phase change material layer 650 outside the via hole 640 in the insulating layer 620, wherein the metal layer 630 is on the side of the phase change material layer 650, and the metallic compound layer 635 is on the side of the insulating layer 620.

In addition, as can be seen from FIG. 6F, in the second embodiment according to this disclosure, after performing the planarization process, the laminated layer comprising the metal layer 630 and the metallic compound layer 635 beneath the metal layer 630 may be removed so as to expose the insulating layer 620. That is, the laminated layer is used as a sacrificial layer.

Incidentally, after performing the planarization process, for example, a top electrode layer 660 may be formed on the phase change material layer 650 exposed in the via hole 640 (referring to FIG. 6G), and the top electrode layer 660 may be patterned into a top electrode.

According to the method of manufacturing the phase change semiconductor device of the second embodiment of this disclosure shown in FIGS. 5 and 6A-6G, a phase change semiconductor device may be formed, the phase change semiconductor device comprising the phase change material layer 650 formed on the insulating layer 620 having the via hole 640, wherein the laminated layer comprising the metal layer 630 and the metallic compound layer 635 beneath the metal layer 630 is formed at the interface between the insulating layer 620 and the phase change material layer 650 outside the via hole 640 (referring to FIG. 6E).

As can be seen from the above, the time of the annealing step 540 in the second embodiment is different from the time of the annealing step 330 in the first embodiment. That is, in the second embodiment, the laminated layer, which comprises the metal layer and the metallic compound layer beneath the metal layer and which is used for improving adhesion, is formed after forming the via hole in the insulating layer and before forming the phase change material layer. Moreover, from the above teaching, persons skilled in the art easily understand that the second embodiment of this disclosure can achieve the same technical effect as the first embodiment, i.e., can improve adhesion between the phase change material layer and the insulating layer during the formation of the phase change material layer and during the planarization process.

Third Embodiment

A third embodiment of this disclosure differs from the first and second embodiments in the time of subjecting the metal layer to an annealing treatment so as to form the metallic compound layer at the interface between the metal layer and the insulating layer. Specifically, in the third embodiment of this disclosure, the laminated layer for improving adhesion is formed after forming the phase change material layer and before performing the planarization process.

Figure 7:
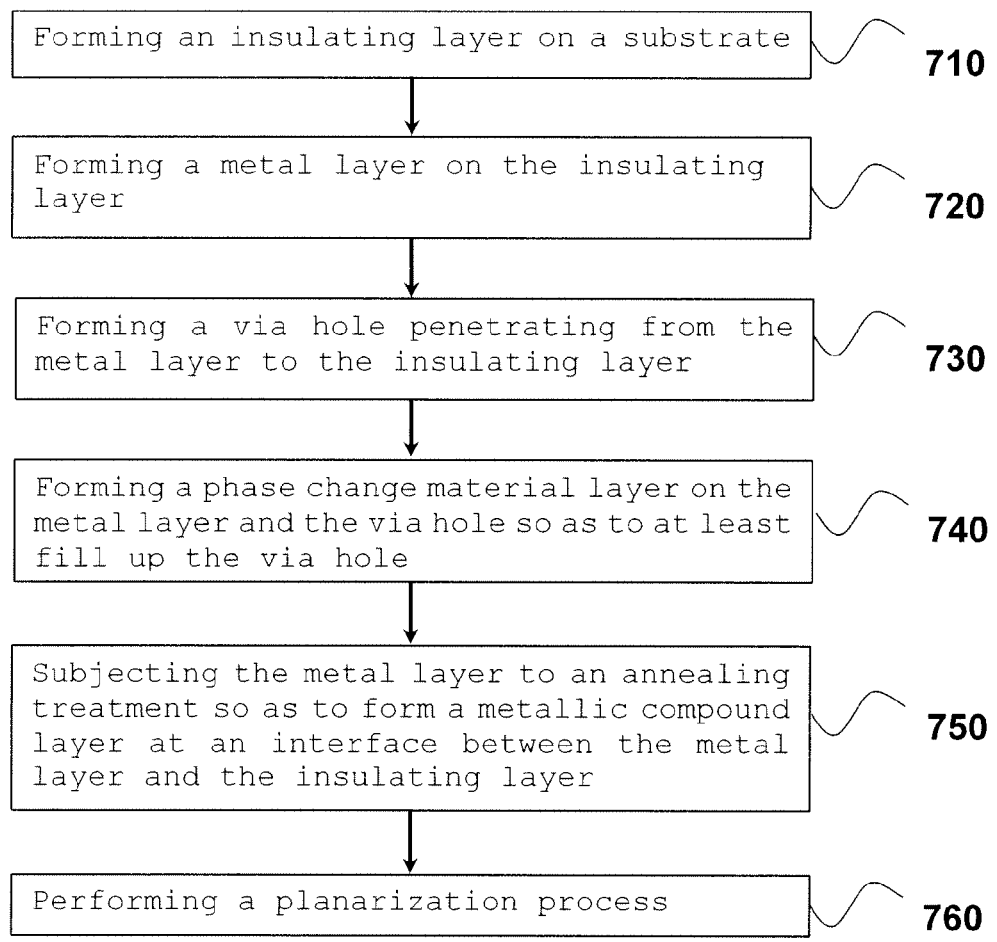
FIG. 7 is a flowchart illustrating a method of manufacturing a phase change semiconductor device according to a third embodiment of this disclosure.

FIG. 7 is a flowchart illustrating a method of manufacturing a phase change semiconductor device according to the third embodiment of this disclosure. FIGS. 8A-8G are schematic diagrams illustrating structures obtained after the respective steps in the method of manufacturing the phase change semiconductor device according to the third embodiment of this disclosure, wherein portions similar to those in FIGS. 4A-4G according to the first embodiment are denoted by similar reference signs. The third embodiment of this disclosure will be described below with referent to FIGS. 7 and 8A-8G, wherein only the difference between the third embodiment and the first embodiment will be described in detail; other parts of the third embodiment are the same as those in the first embodiment, and description of the first embodiment may be referred to for details.

Figure 8A:
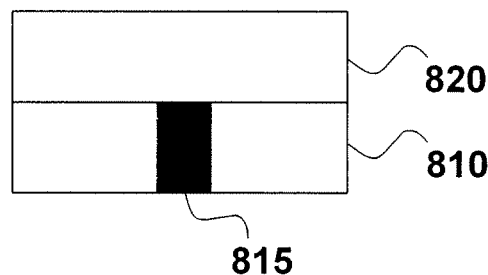
FIGS. 8A-8G are schematic diagrams illustrating structures obtained after the respective steps in the method of manufacturing the phase change semiconductor device according to the third embodiment of this disclosure.

First, in step 710 of FIG. 7, an insulating layer 820 is formed on a substrate 810 (referring to FIG. 8A). In addition, a bottom electrode 815 used for a phase change semiconductor device is formed in the substrate 810.

Incidentally, optionally, after forming the insulating layer 820 on the substrate 810, it can be subjected to a degassing treatment so as to remove water vapor or the like therein.

Figure 8B:
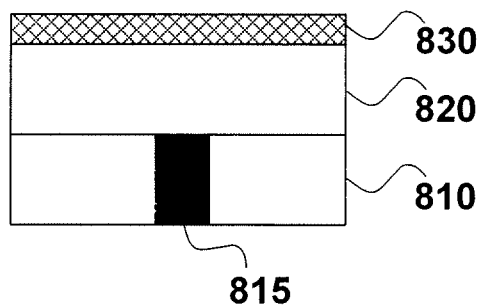

Next, in step 720 of FIG. 7, a metal layer 830 is formed on the insulating layer 820 (referring to FIG. 8B). The material of the metal layer 830 is not limited particularly, and it may be, for example, Mn, Ni, Al, Mg, Co or Ti.

Figure 8C:
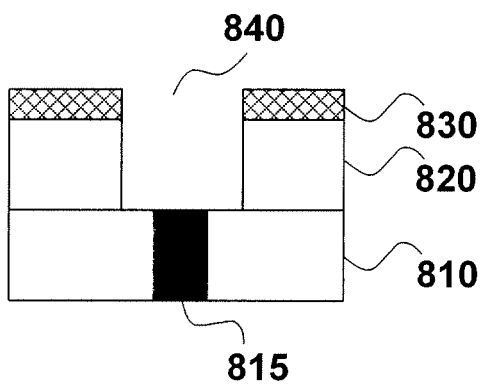

Then, in step 730 of FIG. 7, a via hole 840 is formed penetrating from the metal layer 830 to the insulating layer 820 (referring to FIG. 8C). The formed via hole 840 exposes the bottom electrode 815 in the substrate 810.

Figure 8D:
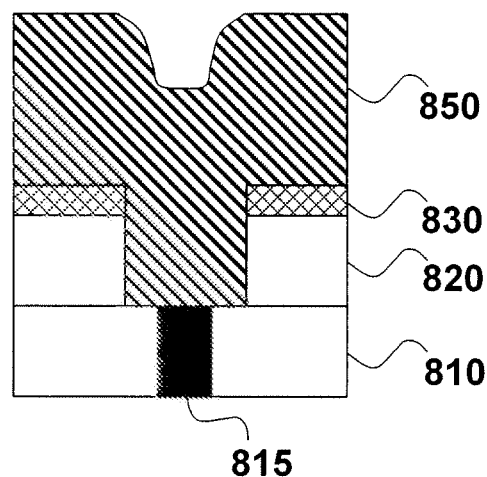

Next, in step 740 of FIG. 7, a phase change material layer 850 is formed on the metal layer 830 and the via hole 840 so as to at least fill up the via hole 840 (referring to FIG. 8D). After filling the phase change material layer 850 in the via hole 840, the bottom electrode 815 in the substrate 810 is electrically connected to the phase change material layer 850 filled in the via hole 840.

Figure 8E:
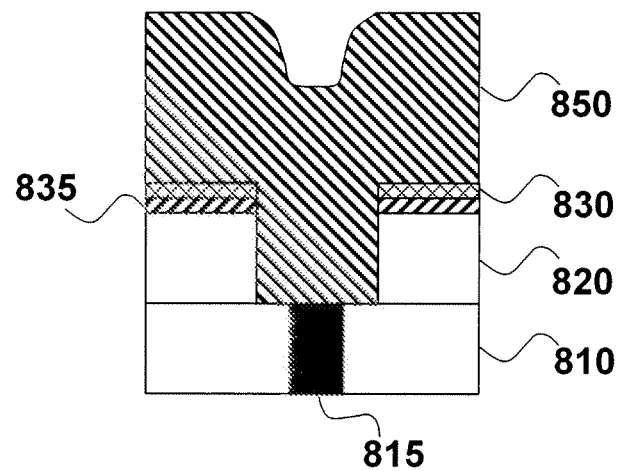

After forming the phase change material layer 850, in step 750 of FIG. 7, the metal layer 830 is subjected to an annealing treatment so as to form a metallic compound layer 835 at an interface between the metal layer 830 and the insulating layer 820 (referring to FIG. 8E). For example, when the metal layer 830 is a Mn layer and the insulating layer 820 is a silicon oxide layer, the metallic compound layer 835 formed after the annealing treatment is a Mn—Si—O layer. In addition, the annealing treatment may also make the formed phase change material layer 850 to change from an amorphous state into a crystalline state simultaneously.

As can be seen from FIGS. 8D and 8E, in the third embodiment according to this disclosure, after forming the phase change material layer 850, a laminated layer comprising the metal layer 830 and the metallic compound layer 835 beneath the metal layer 830 is formed at an interface between the insulating layer 820 and the phase change material layer 850 outside the via hole 840 in the insulating layer 820 by the annealing treatment, wherein the metal layer 830 is on the side of the phase change material layer 850, and the metallic compound layer 835 is on the side of the insulating layer 820. However, unlike the first and second embodiments, in the third embodiment of this disclosure, the laminated layer is not formed during the formation of the phase change material layer 850 (referring to FIG. 8D).

Incidentally, as shown in FIG. 8E, the laminated layer, which comprises the metal layer 830 and the metallic compound layer 835 beneath the metal layer 830 and which is used for improving adhesion, is only formed at the interface between the insulating layer 820 and the phase change material layer 850 outside the via hole 840 in the insulating layer 820, and is not formed at an interface between the insulating layer 820 and the phase change material layer 850 inside the via hole 840.

Then, in step 760 of FIG. 7, a planarization process is performed. After performing the planarization process, the laminated layer comprising the metal layer 830 and the metallic compound layer 835 beneath the metal layer 830 may be retained. Alternatively, after performing the planarization process, the laminated layer may also be removed so as to expose the insulating layer 820 and the phase change material layer 850 in the via hole 840 (referring to FIG. 8F).

Figure 8F:
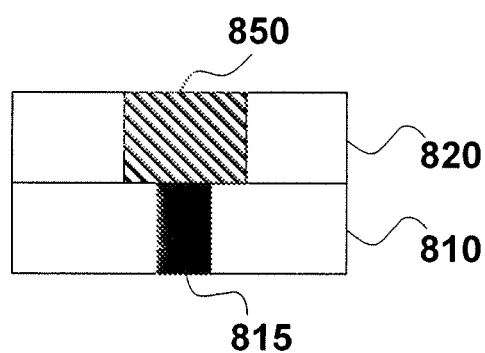
Figure 8G:
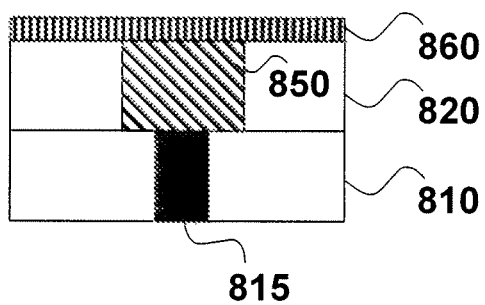

As can be seen from FIGS. 8E-8F, in the third embodiment according to this disclosure, during the planarization process, there is the laminated layer comprising the metal layer 830 and the metallic compound layer 835 beneath the metal layer 830 which is formed at the interface between the insulating layer 820 and the phase change material layer 850 outside the via hole 840 in the insulating layer 820, wherein the metal layer 830 is on the side of the phase change material layer 850, and the metallic compound layer 835 is on the side of the insulating layer 820.

In addition, as can be seen from FIG. 8F, in the third embodiment according to this disclosure, after performing the planarization process, the laminated layer comprising the metal layer 830 and the metallic compound layer 835 beneath the metal layer 830 may be removed so as to expose the insulating layer 820. That is, the laminated layer is used as a sacrificial layer.

Incidentally, after performing the planarization process, for example, a top electrode layer 860 may be formed on the phase change material layer 850 exposed in the via hole 840 (referring to FIG. 8G), and the top electrode layer 860 may be patterned into a top electrode.

According to the method of manufacturing the phase change semiconductor device of the third embodiment of this disclosure shown in FIGS. 7 and 8A-8G, a phase change semiconductor device may be formed, the phase change semiconductor device comprising the phase change material layer 850 formed on the insulating layer 820 having the via hole 840, wherein the laminated layer comprising the metal layer 830 and the metallic compound layer 835 beneath the metal layer 830 is formed at the interface between the insulating layer 820 and the phase change material layer 850 outside the via hole 840 (referring to FIG. 8E).

As can be seen from the above, the time of the annealing step 750 in the third embodiment is different from the time of the annealing step 330 in the first embodiment. That is, in the third embodiment, the laminated layer, which comprises the metal layer and the metallic compound layer beneath the metal layer and which is used for improving adhesion, is formed after forming the phase change material layer and before performing the planarization process. Moreover, from the above teaching, persons skilled in the art easily understand that the third embodiment of this disclosure can improve adhesion between the phase change material layer and the insulating layer only during the planarization process.

While this disclosure has been described with reference to exemplary embodiments, it shall be understood that this disclosure is not limited to the described exemplary embodiments. It is obvious to persons skilled in the art that the above exemplary embodiments may be modified without deviating from the spirit and scope of this disclosure. The scope of the appended claims shall be accorded with the broadest interpretation so as to encompass all such modifications and equivalent structures and functions.

What is claimed is:

1. A method of manufacturing a phase change semiconductor device, comprising steps of:
    forming an insulating layer on a substrate;
    forming a metal layer on the insulating layer;
    forming a via hole penetrating from the metal layer to the insulating layer, wherein the metal layer is only outside the via hole;
    forming a phase change material layer on the metal layer and the via hole so as to at least fill up the via hole; and
    performing a planarization process,
    wherein the method further comprises a step of:
    after forming the metal layer and before forming the via hole, or after forming the via hole and before forming the phase change material layer, or after forming the phase change material layer and before performing the planarization process, subjecting the metal layer to an annealing treatment so as to form a metallic compound layer at an interface between the metal layer and the insulating layer.

2. The method of manufacturing the phase change semiconductor device of claim 1, wherein the step of performing the planarization process makes the insulating layer and the phase change material layer in the via hole exposed.

3. The method of manufacturing the phase change semiconductor device of claim 1, wherein a temperature of the annealing treatment is in a range of 200° C. to 400° C., and a time of the annealing treatment is in a range of 10 minutes to 120 minutes.

4. The method of manufacturing the phase change semiconductor device of claim 1, wherein the metal layer is a Mn layer, a Ni layer, an Al layer, a Mg layer, a Co layer or a Ti layer.

5. The method of manufacturing the phase change semiconductor device of claim 1, wherein the metal layer is a Mn layer, and the metallic compound layer is a Mn—Si—O layer.

6. The method of manufacturing the phase change semiconductor device of claim 1, wherein the step of forming the metal layer on the insulating layer comprises:

forming the metal layer with a thickness in a range of 50 Å to 500 Å on the insulating layer.

7. The method of manufacturing the phase change semiconductor device of claim 1, wherein the phase change material layer is a chalcogenide layer.

8. The method of manufacturing the phase change semiconductor device of claim 7, wherein the chalcogenide layer is a Ge—Sb—Te layer, a Ge—Te layer, a Sb—Te layer, an As—Sb—Te layer, a Si—Sb—Te layer, a Ge—Bi—Te layer, a Sn—Sb—Te layer, an In—Sb—Te layer or a Ga—Sb—Te layer.

9. The method of manufacturing the phase change semiconductor device of claim 1, wherein the insulating layer is a silicon oxide layer.

10. The method of manufacturing the phase change semiconductor device of claim 1, wherein the phase change material layer is formed by physical vapor deposition.

11. The method of manufacturing the phase change semiconductor device of claim 1, wherein the planarization process is performed by chemical mechanical planarization.

12. The method of manufacturing the phase change semiconductor device of claim 1, further comprising a step of:

subjecting the substrate to a degassing treatment before forming the metal layer on the insulating layer.

13. The method of manufacturing the phase change semiconductor device of claim 12, wherein a temperature of the degassing treatment is in a range of 250° C. to 400° C., and a time of the degassing treatment is in a range of 1 minute to 30 minutes.

* * * * *